United States Patent [19]
Miller

[11] Patent Number: 4,722,913
[45] Date of Patent: Feb. 2, 1988

[54] DOPED SEMICONDUCTOR VIAS TO CONTACTS

[75] Inventor: Robert O. Miller, The Colony, Tex.

[73] Assignee: Thomson Components-Mostek Corporation, Carrollton, Tex.

[21] Appl. No.: 920,251

[22] Filed: Oct. 17, 1986

[51] Int. Cl.$^4$ .................... H01L 21/263; H01L 29/28
[52] U.S. Cl. ................................ 437/196; 437/234;
437/41; 437/26; 437/967; 357/6; 357/91;
357/23.1; 357/61; 357/65; 427/122
[58] Field of Search ..................... 29/576 B, 591, 571;
148/DIG. 76, DIG. 20, DIG. 23, DIG. 40;
357/23.1, 61, 91, 6, 65; 427/85

[56] References Cited

U.S. PATENT DOCUMENTS 4,214,918 7/1980 Gat et al. .............................. 148/1.5
4,472,210 9/1984 Wu et al. ............................... 148/1.5
4,511,445 4/1985 Forrest et al. ........................ 428/442

Primary Examiner—Brian E. Hearn
Assistant Examiner—Beverly A. Pawlikowski
Attorney, Agent, or Firm—Roland Plottel

[57] ABSTRACT

In the manufacture of integrated circuits, an undoped wide band-gap semiconductor is used for the insulating layer to isolate the silicon substrate from the metal interconnection pattern. To provide conductive vias through the insulating layer for connection to the source and drain of the transistors of the circuit, the wide band-gap semiconductor is implanted with a dopant selectively in the portion overlying the source and drain for making the implanted portion of low resistivity and of the conductivity type of the source and drain. Preferably, carbon is the wide band-gap semiconductor and nitrogen is the dopant implanted.

2 Claims, 1 Drawing Figure

U.S. Patent  Feb. 2, 1988  4,722,913
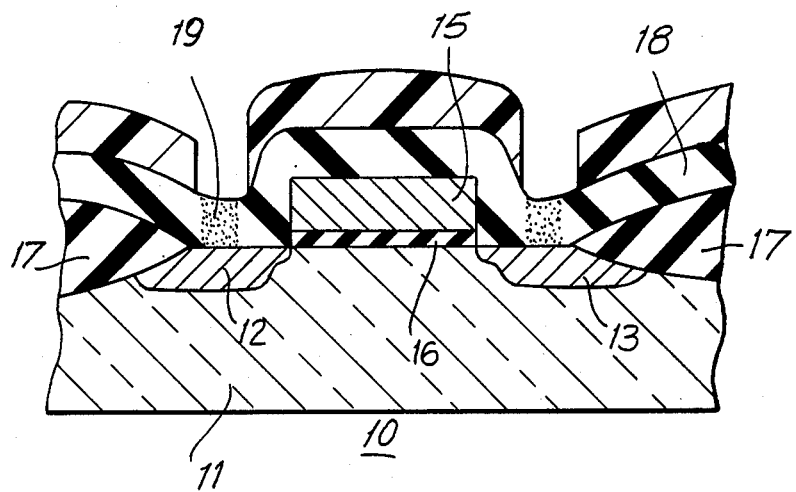

4,722,913

DOPED SEMICONDUCTOR VIAS TO CONTACTS

FIELD OF INVENTION

This invention relates to the fabrication of integrated circuit devices.

BACKGROUND OF THE INVENTION

In the fabrication of integrated circuit devices, some processes developed depend on the conversion in resistivity of selected portions of a film of an insulator overlying a region to which low resistance electrical connections need to be made, for example, the source and drain regions of an MOS transistor. Such conversion avoids the need for removal of such portions of the insulating film, which removal may be difficult and which may leave openings which are difficult to penetrate reliably for making electrical connection to the underlying regions. One technique previously proposed has been to increase locally the conductivity of the film by the introduction of dopants so that electrical connection can be made to the local portion of the film avoiding the need for making an opening in the film. However, it proves difficult to dope films of insulating materials sufficiently to increase the conductivity to the desired level, because of limitations in available implantation apparatus and the tendency of the substrate to be affected by such heavy doping.

SUMMARY OF THE INVENTION

To facilitate the conversion of an insulating film, the invention utilizes for the film, a wide band-gap semiconductor such as carbon, that has a high resistivity in its intrinsic undoped state, but that can be readily converted to have a relatively low resistivity when implanted with nitrogen.

BRIEF DESCRIPTION OF THE DRAWINGS

The invention will be better understood from the following more detailed description taken with the drawing which shows a semiconductive device at an intermediate stage of processing in accordance with the invention.

DETAILED DESCRIPTION

The drawing shows in section a semiconductive device, for example, a conventional MOS transistor 10, which comprises a substrate 11, typically monocrystalline silicon which includes spaced source and drain regions 12 and 13, respectively, to each of which a separate low resistance connection needs to be made. Additionally, the transistor includes a gate 15 which overlies the channel region between the source and drain and is insulated therefrom by a thin oxide film 16. Thick field oxide regions 17 are used to isolate the transistor from other portions of the integrated circuit. It is generally necessary to provide an insulating film or layer 18 which extends over the transistor to isolate the substrate and gate from overlying metal layers (not shown) which provide connections to the source drain and gate and interconnections between the circuit elements. Typically, this layer 18 is of a dielectric material such as silicon oxide. Since low resistance connection needs to be made to the source and drain regions, this portion of the layer 18 shown stippled in the drawing, overlying the source and drain needs needs either to be opened up or to be converted to a good conductor. This has proved a difficult problem, particularly when the source and drain are relatively shallow and of limited surface area.

In accordance with the invention, the layer 18 is made of a semiconductive material that has a relatively wide band gap to be of high resistivity in its intrinsic or undoped state, such as carbon or some forms of amorphous silicon, but that can be implanted with dopants to have its resistivity sufficiently reduced in the implanted region that such regions acts as a conductor, permitting a low resistance connection therethrough to the source and drain.

To this end, there is first deposited a uniform layer 18 of the chosen material, for example, carbon, over the transistor, to a sufficient thickness that it can serve as a satisfactory dielectric layer for isolating the substrate from the overlying metal layers to be deposited over the layer 18. This requires a thickness adequate to avoid pinholes and typically will be 5000 Angstroms thick. The carbon layer is then coated with a layer of a photoresist 19 of the kind normally used for photolithographic patterning. The photoresist is then patterned in the usual fashion to form openings in the photoresist selectively over the stippled regions of the layer 18 to be converted to low resistivity by implantation. After the openings are formed, the layer 18 is implanted with dopants of the type to convert the implanted regions to the same conductivity type as the source and drain. Typically, these are N-type for the popular N-channel transistor, in which case nitrogen can be implanted to make the implanted carbon N-type. After implantation, and stripping of the remaining photoresist, the transistor is annealed in the usual fashion to activate the implanted ions by substituting them in the carbon lattice. Annealing at about 900 C. is typical. A typical doping would be an average concentration of about nitrogen 10 exp 17–10 exp 18 ions per CC.

Any of the known techniques can be used for depositing the carbon. Typically, these involve a radio frequency plasma deposition process using a hydrocarbon gas as the carbon source. Other known processes involve ion beams, ion plating or pulsed plasmas.

In some instances, it may prove advantageous first to thin the carbon film selectively where its resistivity is to be reduced to reduce the accelerating voltage that needs to be used to implant the nitrogen ions the full thickness of the film. This can readily be done by coating the film with a positive photoresist, developing the photoresist appropriately, and etching the photoresist in an oxygen plasma, such that where the photoresist has been first removed and the carbon film exposed, continued etching will thin the carbon film. After thinning the carbon film, the process proceeds as before.

The choice of carbon is advantageous for several reasons. It is easily deposited and generally is not entirely amorphous as deposited but has a substantially crystalline phase intermediate between graphite and diamond with a definite band-gap that is wide and so makes for good insulating properties with little temperature sensitivity. Additionally, carbon has good interface properties with silicon and silicon oxide. Finally, its susceptibility to etching in an oxygen plasma allows etching back planarization by use of a sacrificial photoresist.

In some instances, it may prove beneficial to employ some other semiconductor for layer 18, such as amorphous silicon that has high resistivity undoped, but that can be doped in the manner of crystalline silicon to increase its conductivity.

It can be appreciated that other variations on the specific examples described may be developed without departing from the spirit and scope of the invention.

What is claimed:

1. In a process of manufacturing an integrated circuit in which a low resistance connection is made to a localized region of a semiconductive substrate of one conductivity type underlying a layer which is normally an insulating layer, the improvement comprising forming the normally insulating layer of a wide band-gap undoped semiconductive carbon to be of high resistivity, and implanting selectively the portion of the layer overlying the region to be connected with a dopant said dopant being of the same conductivity type as the localized region.

2. The process of claim 1 in which the substrate is silicon and the dopant implanted is nitrogen to make the implanted portion n-type of low resistivity.

* * * * *